United States Patent [19]

Nishizawa

[11] 4,198,648
[45] Apr. 15, 1980

[54] INTEGRATED SEMICONDUCTOR DEVICE

[75] Inventor: Jun-ichi Nishizawa, Sendai, Japan

[73] Assignee: Zaidan Hojin Handotai Kenkyu Shinkokai, Sendai, Japan

[21] Appl. No.: 902,965

[22] Filed: May 4, 1978

[30] Foreign Application Priority Data

May 15, 1977 [JP] Japan .................................. 52/55778

[51] Int. Cl.$^2$ ........................................... H01L 27/02
[52] U.S. Cl. ........................................ 357/43; 357/22; 357/41; 357/46; 357/50; 357/55
[58] Field of Search ....................... 357/22, 41, 43, 46, 357/50, 55

[56] References Cited

PUBLICATIONS

IEEE Trans. on Electron Devices, vol. ED-22, pp. 185–197, Apr. 1975.

Primary Examiner—Edward J. Wojciechowicz
Attorney, Agent, or Firm—Cushman, Darby & Cushman

[57] ABSTRACT

An integrated semiconductor device comprising: a first and a second static induction transistor each including a drain and a source, each having a first conductivity type, a current channel having the first conductivity type and located between the drain and the source, and a gate having a second conductivity type opposite to the first conductivity type and located adjacent to the current channel; and a third bipolar transistor including a collector and an emitter each having the second conductivity type, and a base having the first conductivity type and located between the collector and the emitter, the collector being connected to the gates of the first and second transistors and also to the drain of the second transistor, the source of the second transistor being connected to the source of the first transistor. The second transistor is operative for suppressing the occurrence of an unrequired excessive minority carrier injection in the first transistor.

25 Claims, 9 Drawing Figures

INTEGRATED SEMICONDUCTOR DEVICE

BACKGROUND OF THE INVENTION (a) Field of the Invention

The present invention is related to an integrated semiconductor device, and more particularly it pertains to a Static Induction Transistor Logic (SITL) device including a static induction transistor and a bipolar transistor.

(b) Description of the Prior Art

A Static Induction Transistor Logic device (SITL device), which is a unique modification of the conventional IIL device employing bipolar transistors to serve as the injector and the driver, respectively, has been proposed in Japanese Patent Application No. 50-146588 (corresponding U.S. Patent Application Ser. No. 748292/1976 by Jun-ichi NISHIZAWA), and Japanese Patent Application No. 51-92467 (corresponding U.S. Pat. Application Ser. No. 819343/1977 by Jun-ichi NISHIZAWA et al) for instance. The basic arrangement of such an SITL device is shown in an equivalent circuit in FIG. 1. As shown, the SITL device has a bipolar transistor $Q_1$ serving as the injector and a static induction transistor $Q_2$ serving as the driver. The collector of the injector transistor $Q_1$ is coupled to the gate of the driver transistor $Q_2$, and the base of the injector transistor $Q_1$ and the source of the driver transistor $Q_2$ are mutually coupled together. For a usual operation of this SITL device, the emitter of the injector $Q_1$ is applied with a constant potential $V_{EE}$, and the source of the driver $Q_2$ is grounded. This SITL device will operate in a manner similar to that of the conventional IIL device employing bipolar transistors to serve as an injector and a driver, but is far superior to the conventional IIL device in many respects, as will be described below.

First, the static induction transistor serving as the driver $Q_2$, basically, is a majority carrier control device, and therefore it is subjected, only to an extremely reduced extent, to the so-called minority carrier storage effect which contributes to limiting the switching speed of the driver transistor in the conventional IIL device. Consequently, the SITL device can provide a much higher speed in switching operation as compared with that of the conventional IIL device.

Second, the static induction transistor, basically, is a voltage-controlled device, so that only a small amount of power is required in the driving of the driver transistor and that the driver transistor can be easily coupled to the output of the preceding stage circuit. Also, the power loss in the driver transistor itself is small. Accordingly, the SITL device will allow a high-density integration.

Third, the static induction transistor as the driver has a large transconductance and can provide an increased number of fan-outs. As a result, the SITL device can perform any required logical operation with a simple circuit arrangement.

Fourth, the SITL device has the advantage that it is simple in construction and that it can be easily formed into a high integration density by a simple manufacturing process, as will be explained below with reference to FIGS. 2 and 3.

An example of the basic structure of an integrated SITL device as mentioned above is illustrated in a top plan view in FIG. 2 and is also shown in FIG. 3 in a vertical section taken along the line III—III of FIG. 2. The SITL includes a semiconductor wafer 10 consisting of a heavily doped $n^+$ type substrate 13 and a lightly doped $n^-$ type layer 14. In the semiconductor layer 14 are provided a heavily doped $p^+$ type region 11, and a heavily doped $p^+$ type region 12 of a mesh-like shape. In upper portions of the layer 14, in those portions surrounded by the region 12, there are provided heavily doped $n^+$ type regions 15 and 16. The regions 11, 12 and a portion of the layer 14 which is sandwiched between the regions 11 and 12 jointly constitute a lateral bipolar transistor serving as an injector transistor $Q_1$ as shown in FIG. 1. In further detail, the region 11 functions as an emitter; the region 12 functions as a collector; and the sandwiched portion of the layer 14 functions as base. On the other hand, the layers 12, 13, 14, 15 and 16 form, jointly therewith, a static induction transistor serving as a driver transistor $Q_2$ as shown in FIG. 1. More particularly, the substrate 13 functions as a source; the region 12 functions as a gate; and the regions 15 and 16 function as respective drains. The current channels of the static induction transistor are defined to be those portions of the layer 14 which are surrounded by the region 12. There are provided, on the corresponding locations drain electrodes $D_1$ and $D_2$, a gate/collector electrode G/C, an emitter electrode E, and a source/base electrode S/B. A passivation film layer 17, such as a silicon dioxide film, a silicon nitride film layer and so on, is formed on the exposed upper surface of the semiconductor wafer 10.

As will be easily understood from FIGS. 2 and 3, the SITL device can be manufactured by relying on a simple processing technique wherein the impurity diffusion step is conducted only two times, and four masks are required at most, for instance.

With such a simple structure as well as such a simple process, there has been obtained an integrated SITL device whose power-delay product for low current operation is decreased to as low as 0.002 pJ or less. Furthermore, a specimen of such SITL device exhibiting a minimized delay time of 13.8 nanoseconds or less in an operation with a power dissipation of 230 microwatts has been materialized according to the structure of FIGS. 2 and 3. In this specimen, the semiconductor layer 14 has an impurity concentration of about $10^{14}$ atoms/cm$^3$ and a thickness of about 6 micro-meters, the gate region 12 has an impurity concentration of about $10^{17}$ atoms/cm$^3$ or more and a thickness of about 2 micro-meters, and the gate mask distance is set to be about 6 micro-meters. The above mentioned delay time of the SITL device contains several factors such as a delay for charging up the gate capacitance of the driver transistor, a delay for carrier transit across the source and the drain of the driver transistor, a carrier storage effect due to unnecessary minority carriers injected from the gate into a high resistivity region arround the gate other than the current channel of the driver transistor, a carrier storage effect due to excessive minority carriers injected from the gate into the current channel, and like factors. The former three delay factors may be reduced drastically, by minimizing the thickness of the high resistivity layer 14 (see FIG. 3) to thereby bring the gate 12 into a substantial contact with the low resistivity layer 13 and thereby to reduce the effective distance between the source and the drains 15 and 16, and by minimizing the effective area of the gate 12, for instance. The provision of an insulator region at the outer boundary of the driver gate may be effective for preventing the occurrence of an unnecessary carrier injection at the boundary. The last factor may also be somewhat reduced by a decrease in the gate area. In this manner, there has been obtained, in fact, a specimen of the SITL device whose delay time is reduced to as small as 4 nanoseconds or less.

The afore-mentioned excellent operating characteristics of the SITL device can never be attained by the conventional IIL device, particularly by the use of the conventional IIL device designed to provide many fan-outs. Some known modified IIL device composed of only bipolar transistors, such as the known VIL (Vertical Injection Logic) device and SSL (Self-Aligned Super Injection Logic) device, might be seen as being somewhat comparable to the SITL device only in the delay time characteristic (representative minimum delay time is 8 nanoseconds), but their power-delay product is roughly thirty times or more as large as that of the SITL device. Moreover, these known modified IIL devices are extremely complicated in structure and fairly hard to manufacture as compared with the SITL device.

The SITL device has many excellent features as mentioned above, but still it leaves a problem to be improved. This problem is represented by the minority carrier storage effect which is developed in the static induction transistor serving as the driver transistor of the SITL device, which is caused by the excessive minority carriers injected into the current channel from the gate when the driver transistor is in the conductive state. Namely, the current which is supplied by the injector transistor, after having charged the gate capacitance of the driver transistor up to a required potential, will continue to flow to charge the gate capacitance up to an excessively high potential, because the injector current is usually kept substantially constant. As a result, the gate junction of the driver transistor is deeply forward-biased, so that an excessively large amount of carriers are injected, thus bringing about the above-described carrier storage effect. Since a static induction transistor, basically, is a majority carrier control device, the degree of the minority carrier storage effect developing at the current channel of the static induction transistor serving as the driver is very low as compared with that in a bipolar transistor. However, the carrier storage effect constitutes a great obstruction in attaining a further increase in the operating speed of the SITL device.

Such minority carrier storage effect at the current channel in the driver static induction transistor might be eliminated by replacing the injector bipolar transistor in the SITL device by a static induction transistor, as proposed in Japanese Patent Application No. 52-4633 (corresponding U.S. Patent Application Ser. No. 867298/1978 by Jun-ichi NISHIZAWA), and in Japanese Patent Application No. 52-15879 in which the inventor is Jun-ichi NISHIZAWA. Suppose that a device to be employed as the injector transistor has such ideal drain-source voltage $V_{ds}$ versus drain current $I_d$ characteristic as shown by the solid line in FIG. 4, in which after the gate potential of the driver transistor has exceeded a certain potential $V_{go}$ necessary to render the driver transistor conductive, the drain current $I_d$ becomes suppressed to a desirable minimized value. In case an injector transistor has such characteristic as stated just above, the unrequired excessive minority carrier injection in the driver transistor can be suppressed, and thus the carrier storage effect is greatly reduced. In addition, if the injector static induction transistor is able to supply a sufficiently large amount of drain current $I_d$ to quickly charge the gate capacitance of the driver transistor up to said potential $V_{go}$, a sufficiently high speed turning-on operation could be performed by the driver transistor. It should be noted, however, that an actual static induction transistor has such a drain-source voltage versus drain current characteristic as shown by the dash-and dot line in FIG. 4. Namely, as the gate capacitance of the driver transistor is being charged up with the injector drain current and as, thus, the gate potential of the driver transistor together with the drain potential of the injector transistor is being pulled up, the drain current of the injector transistor will tend to gradually decrease because of its decreasing drain-source voltage. For this reason, practically speaking, it is impossible to accomplish at the same time both the elimination of the excessive minority carrier injection and the quick charging-up of the gate capacitance of the driver transistor, in accordance with such arrangement of the SITL device wherein the injector is replaced by a static induction transistor.

SUMMARY OF THE INVENTION

It is, therefore, a general object of the present invention to provide an improved integrated semiconductor device which is capable of making switching operations at an increased speed.

Another object of the present invention is to provide an integrated semiconductor device of the type described, which is simple in structure and which can be formed easily with a high integration density.

A further object of the present invention is to provide an improved SITL device which is operable at a higher speed as compared with the SITL device of the prior art.

A still further object of the present invention is to provide an SITL device of the type described, in which the driver transistor is substantially free from the unnecessary minority carrier storage effect.

A yet further object of the present invention is to provide an SITL device of the type described, in which the potential level for input and/or output is selectable over a wide range.

According to one aspect of the present invention, there is provided an SITL device including an injector bipolar transistor, a driver static induction transistor and a bypath static induction transistor, all of which being formed in a single common semiconductor body, said injector transistor comprising: an emitter having a first conductivity type, a collector having said first conductivity type, and a base having a second conductivity type opposite to said first conductivity type and sandwiched between said emitter and said collector; each of said driver and said bypath transistors comprising: a source having said second conductivity type, a drain having said second conductivity type, a current channel having said second conductivity type and located between said drain and said source, and a gate having said first conductivity type and located adjacent to said current channel to define a boundary of said current channel, said collector of said injector transistor and said drain of said bypath transistor being electrically connected in common to said gate of said driver transistor, said gate of said bypath transistor being electrically connected to said drain of said bypath transistor, said sources of both said driver and said bypath transistors being electrically connected together. Said bypath transistor may be given such a variable resistance characteristic, for instance, that the internal resistance of this bypath transistor will decrease with an increase in the voltage applied between the drain and the source.

These and other objects as well as the features and the advantages of the present invention will become apparent from the following detailed description of the preferred embodiments when taken in conjunction with the accompanying drawings.

DETAILED DESCRIPTION OF THE PREFERRED EMBODIMENTS

Figure 5:
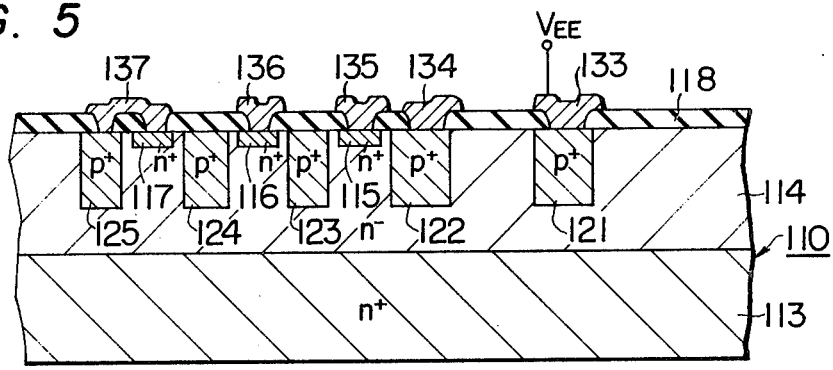
FIG. 5 is a vertical sectional view of an example of the SITL device according to the present invention.

An example of the improved SITL device according to the present invention is shown in vertical section in FIG. 5. The SITL device includes a semiconductor wafer 110 comprised of a heavily doped n+ type substrate 113 and a lightly doped n− type layer 114. The semiconductor layer 114 may be formd by relying on the conventional epitaxial growth technique or diffusion technique, for instance. Alternatively, the layer 113 may be formed to be a buried region in a p+ type substrate. In the semiconductor layer 114, which is made of silicon, for instance, there are provided individual highly doped p+ type region 121, 122, 123, 124 and 125. The regions 122 through 125 need to be held at a same potential, so that they are electrically connected together. In general, all of the regions 122 through 125 preferably may be formed in a continuous form such as a grid, mesh shape or stripe shape. At those locations in the semiconductor layer 114 which are surrounded by the respective regions 122 through 125, there are provided separate heavily doped n+ type regions 115, 116 and 117. There are deposited ohmic electrodes 133, 134, 135 and 136 on the regions 121 through 116, respectively. Also, an ohmic electrode 137 is deposited to make ohmic connection between the two regions 124 and 125. Reference numeral 118 represents a passivation film of an insulating material such as silicon dioxide, which covers the exposed portions of the upper surface of the semiconductor layer 114.

In the embodiment of FIG. 5, the n+ type layer 113 and the n+ type regions 115 through 117 have an impurity concentration of $10^{18} \sim 10^{21}$ atoms/cm$^3$. The n− type layer 114 has an impurity concentration of $10^{11} \sim 10^{15}$ atoms/cm$^3$. Each of the p+ type regions 121 through 125 has an impurity concentration of $10^{17} \sim 10^{21}$ atoms/cm$^3$.

Figure 1:
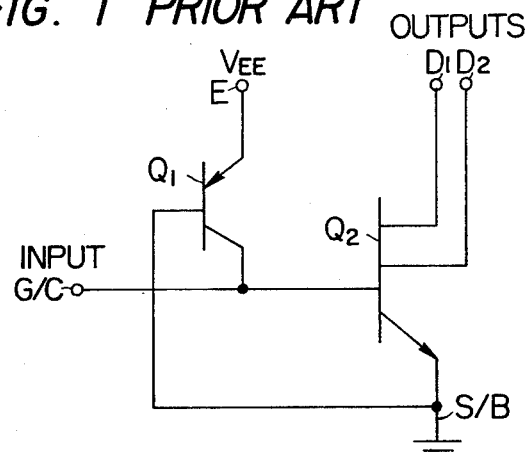
FIG. 1 is a circuit diagram showing an equivalent circuit of an SITL device of the prior art.
Figure 2:
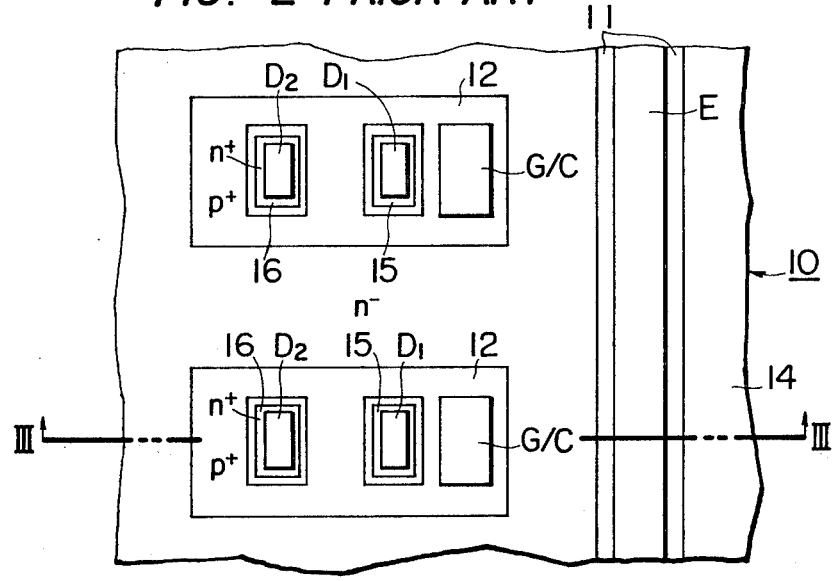
FIG. 2 is a diagrammatic top plan view of an example of an integrated SITL device of the prior art.
Figure 3:
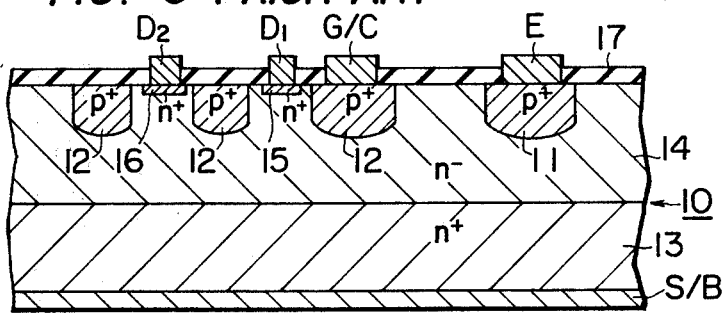
FIG. 3 is a vertical sectional view taken along the line III—III in FIG. 2.
Figure 4:
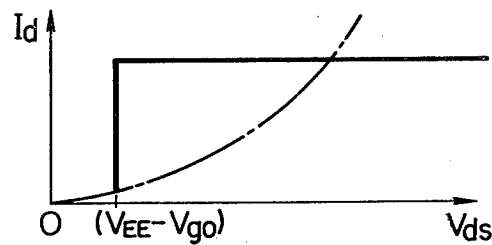
FIG. 4 is a chart for explaining a problem encountered during the attempts of improving the operating characteristics of the prior art SITL device.
Figure 6:
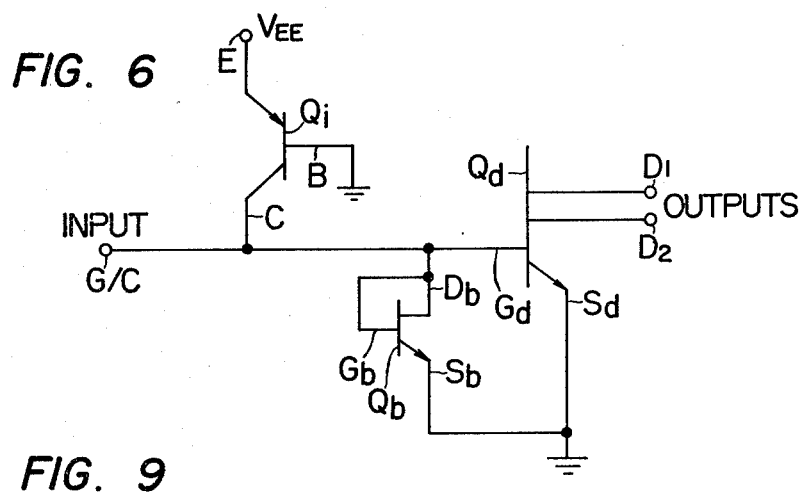
FIG. 6 is a circuit diagram showing an equivalent circuit of the SITL device of FIG. 5.

The equivalent circuit of the SITL device shown in FIG. 5 is illustrated in FIG. 6. In this Figure, reference symbol $Q_i$ represents a pnp type bypolar transistor serving as the injector transistor of the SITL device, and reference symbol $Q_d$ represents an n-channel static induction transistor employed to serve as the driver transistor. The driver transistor $Q_d$ has two separate drains $D_1$ and $D_2$, a gate $G_d$, and a source $S_d$. The injector transistor $Q_i$ has an emitter E, a collector C connected to the gate $G_d$ of the driver transistor, and a base B connected to the source of the driver transistor. In accordance with the present invention, there is introduced an additional n-channel static induction transistor $Q_b$ for providing a current path across the gate source of the driver transistor $Q_d$. This additional transistor $Q_b$, which is hereinafter to be called a bypath transistor, has a gate $G_b$ connected to the gate $G_d$ of the driver transistor $Q_d$, a drain $D_b$ connected to the gate $G_b$, and a source $S_b$ connected to the source $S_d$ of the driver transistor.

Description will now be made on the co-relationship between FIG. 5 and FIG. 6. The driver transistor $Q_d$ comprises layers 113 and 114, and regions 115, 116, 122, 123 and 124. More particularly, the layer 113 serves as the source $S_d$; the regions 122 through 124 serve as the gate $G_d$; the regions 115 and 116 serve as the drains $D_1$ and $D_2$; and those portions of the layer 114 which are surrounded by the respective regions 122 through 124 serve as separated current channels. Similarly, the bypath transistor $Q_b$ is constituted by the layer 113 serving as the source $S_b$, the region 117 serving as the drain $D_b$, the regions 124 and 125 working as the gate $G_b$, and that portion of the layer 113 which serves as the current channel and which is surrounded by the regions 124 and 125. On the other hand, the regions 121 and 122 constitute the emitter E and the collector C of the injector transistor $Q_i$. Also, a portion of the layer 114 located between the emitter and the collector serves as the base B of the injector transistor $Q_i$. As will be apparent, the collector of the injector transistor $Q_i$ and the gate of the bypath transistor $Q_b$ are merged into the gate of the driver transistor $Q_d$, respectively, thereby being held at the same potential with that of the driver gate. Similarly, the source of the bypath transistor $Q_b$ and the base of the injector transistor $Q_i$ are held at the same potential with the source potential of the driver transistor $Q_d$.

The operation of the afore-mentioned embodiment of the present invention will be explained below.

Suppose now that a certain voltage $V_{EE}$ is constantly applied to the emitter E of the injector transistor $Q_i$ to cause this transistor to be rendered conductive, and that a certain external device (not shown) is connected across the gate $G_d$ and the source $S_d$ of the driver transistor $Q_d$.

In case the external device in the preceding stage is turned "on" and the current supplied from the conductive injector transistor is all sunk in the external device, the gate of the driver transistor is held substantially at the low level voltage such as 0.1~0.2 V, for instance. Under this condition, both the driver transistor and the bypath transistor are rendered to the "off" state, because the current channels of these transistors are pinched-off by the gate-channel depletion layers, and because there are thus developed high potential barriers in the current channels. In other words, the static induction transistors $Q_d$ and $Q_b$ are designed so that the gate-channel diffusion potential difference may cause the gate-channel depletion layers extending from the gate to spread all over the current channel. The higher the impurity concentration of either the gate or the current channel is, and also the more abrupt the impurity concentration change at the boundary between the gate and the current channel is, the large will become the gate-channel diffusion potential difference. As the gate-channel diffusion potential difference increases, the static induction transistor logic will be able to have a wider logic voltage swing.

It should be noted here that the bypath transistor has the gate coupled to the drain, and that accordingly this bypath transistor exhibits a voltage-current characteristic wherein the drain current will non-linearly increase with an increase in the drain-source voltage. This voltage-current characteristic is dependent mainly upon the ratio of the distance between the drain and the intrinsic gate, which intrinsic gate being the extrema point of the potential barrier induced in the current channel, to the distance between said intrinsic gate and the source. In general, when the value of the above ratio is a greater one, the bypath transistor will exhibit a more gentle incrementation in the drain current for an increase in the drain-soruce voltage. In the SITL device of the present invention, the voltage-current characteristic of the bypath transistor should be determined in such a way that, when the driver gate potential, i.e., the drain potential of the bypath transistor, is increased up to a certain potential $V_{go}$ which can hold the driver transistor conductive, the bypath transistor turns to be conductive to allow the majority of the current supplied by the injector transistor to flow through this bypath transistor while allowing an adequate part of the current to flow into the gate of the driver transistor.

In this discussion, however, let us suppose that the bypath transistor has a voltage-current characteristic similar to that of a constant-voltage diode. More particularly, let us suppose that the bypath transistor will remain substantially non-conductive for a drain voltage lower than the certain gate voltage $V_{go}$ of the driver transistor, but that for a drain voltage not lower than said certain gate voltage $V_{go}$, the bypath transistor will become conductive, thus keeping the drain-source voltage thereof almost constant. The above voltage $V_{go}$ is about 0.5~0.8 volt in case the SITL device is formed with silicon.

Next, the description will be made on the operation of the afore-mentioned embodiment when the external device in the preceding stage is turned off. Upon turning the external device off, the current, which is an almost constant current and is supplied from the injector transistor, then turns to flow toward the gates of the driver and bypath transistors. At the onset, almost all of the current supplied will flow into the gate capacitance of the driver transistor, because the potential at the driver transistor gate still remains to be very low. Accordingly, the gate capacitance is rapidly charged up, with the result that the gate potential is quickly raised up to said certain gate potential $V_{go}$. As a result, the driver transistor is turned "on" immediately after the turning-off of the preceding stage external device. At substantially the same time with the turning-on of the driver transistor, on the other hand, the bypath transistor will change to become conductive because its drain has been applied with a required voltage not less than $V_{go}$. Therefore, a large part of the current supplied from the injector transistor is bypassed through the bypath transistor and thus a further increase in the driver gate potential is allowed only by a small value.

As described above, once the driver transistor has been turned "on", the driver gate potential is substantially prevented from making a further increase, due to the action of the bypath transistor. Thus, there hardly will occur an unnecessary excessive minority carrier injection into the current channel of the driver transistor nor an unrequired injection of minority carriers into any high resistivity region located adjacent to the gate other than the current channel region of the driver transistor. As a result, the minority carrier storage effect which would take place at the driver transistor is minimized while securing an increased speed of the turning-on action of the driver transistor. It should be noted here that an adequately small amount of minority carriers is constantly injected from the gate into the current channels of the driver transistor to hold this driver transistor in the conducting state. Therefore, the voltage-current characteristic of the bypath transistor must meet the above requirement for the driver transistor. Namely, the internal resistance of the bypath transistor in the conductive state need to be held relatively higher than that of the driver transistor in the conducting state. This condition may be accomplished by setting the width of the current channel of the bypath transistor to be slightly smaller than that of each of the current channels of the driver transistor. Alternatively, for the same purpose, the impurity concentration of the bypath transistor channel need to be determined so as to be slightly lower than that of the current channels of the driver transistor. In short, the bypath transistor should be designed so that there may be induced in its current channel a slightly higher potential barrier than those induced in the current channels of the driver transistor.

When the preceding stage external device is turned "on" again, the driver transistor will immediately turn "off" because of the minimized minority carrier storage effect in the driver transistor.

Figure 7:
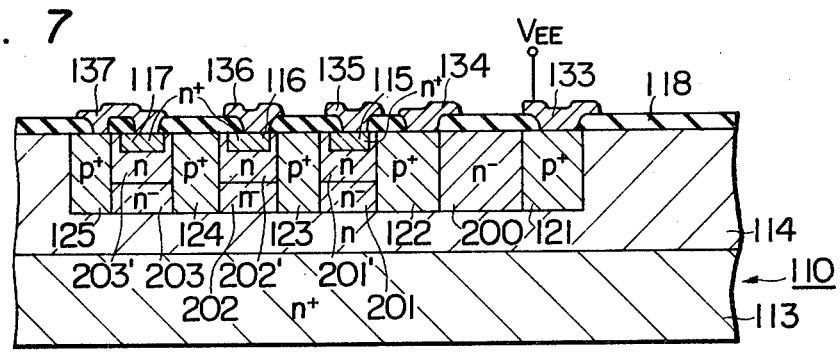
FIGS. 7 and 8 are vertical sectional views of different examples of the SITL device according to the present invention, respectively.

A modification of the SITL device of FIG. 5 is shown in vertical section in FIG. 7. In this example, the impurity concentration of those portions 200, 201, 202 and 203 which serve actually as the base of the injector transistor and the current channels of the driver and bypath transistor, is set to be lower than that of the remaining portions in the layer 114 excepting the gates 122 through 125 and the emitter 121. For instance, the former impurity concentration is set to be about $10^{11} \sim 10^{15}$ atoms/cm$^3$ and the latter impurity concentration is determined to be about $10^{15}$ atoms/cm$^3$ or more. With this arrangement, the minority carriers are allowed to be injected mainly into the real current channel regions 201 through 203 from the gate regions 122 through 125, and also effectively into the base region 200 from the emitter region 121. Because the diffusion potential difference is large, the injection of holes from the p+ type gate regions 122~125 into the n type regions 201'~203' which are located between the n− type regions 201~203 and the n+ type regions 115~117, respectively, is not much intensive. In other words, this arrangement is attributed to a reduction in the unnecessary injection of minority carriers into those high resistivity regions other than the real current channels and the base, and to a further reduction in the minority carrier storage effect in the SITL device.

Needless to say, as the gate regions of the driver transistor is arranged to be smaller, the gate capacitance as well as the minority carrier storage effect of the driver transistor become all the more reduced. Therefore, in the embodiments of FIGS. 5 and 7, the known ion-implantation techinique preferably is applied for forming the gate region small in size.

Figure 8:
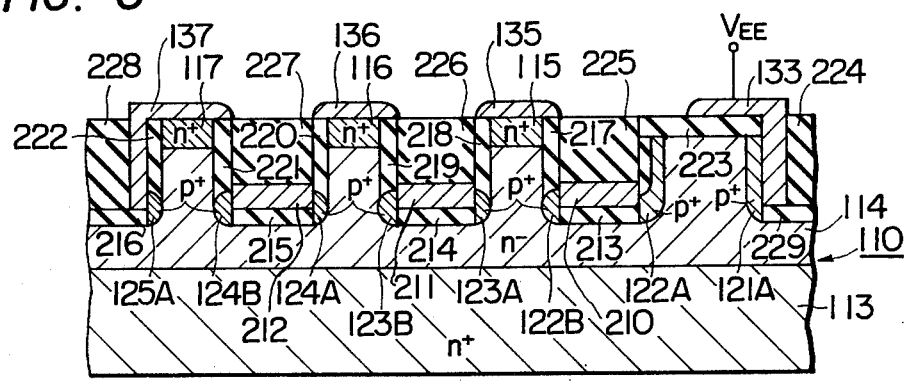

A still another modification of the SITL device of FIG. 5 is illustrated in vertical section in FIG. 8, in which the gates of both the driver transistor and the bypath transistor are formed into minute p+ type regions 122B, 123A, 123B, 124A, 124B and 125A, and in which the collector of the injector transistor is formed as a p+ type region 122A separated from the gate region 122B. All of the respective gate (or collector) regions 122A, 122B, . . . , 125A are electrically and mutually connected to conducting layers 210, 211 and 212 of a conducting material such as aluminum, molybdenum, low-resistivity polysilicon and so forth. The conducting layers 210, 211 and 212 are isolated from the high resistivity layer 114 as well as from the drain regions 115, 116 and 117 by insulating layers 213 through 223 of an insulator material such as $SiO_2$, $Si_3N_4$, $Al_2O_3$ and a combination of any of these materials, thus providing the so-called step-cut structure having recesses. Reference numerals 224 through 228 represent insulating layers, respectively, of an insulator material such as $SiO_2$, $Si_3N_4$, $Al_2O_3$, high-resistivity polysilicon, polyimide resin and so forth. The electrode 137 separated from the high resistivity layer 114 and from the drain region 117 by the insulating layers 216, 222 and 228, and similarly the electrode 133 is separated from the high resistivity layer 114 by the insulating layers 223, 224 and 229.

This embodiment can provide a further improved operation characteristics as will be described below in detail. Each of the gate regions 122B, . . . , 124A can be easily formed into a minute dimension as well as into a heavily-doped region, by applying the selective diffusion technique for forming the gate regions prior to the formation of the insulating layers 225, . . . , 227 and the conducting layers 210, . . . , 212. In addition, those portions of these gate regions other than that which contacts the effective current channels are covered with the insulating layers to thereby be separated from any adjacent high-resistivity region of the layer 114. Therefore, the gate capacitance of the driver transistor can be greatly minimized. Moreover, almost all of the carriers injected into the gate regions from the emitter of the injector transistor are allowed to be drawn exclusively into the current channels, so that the minority carrier storage effect of the driver transistor is greatly reduced. Minority carriers are injected only to the channel, and this is effective in reducing the source to drain resistance of the driver transistor. Furthermore, the emitter 121A and the collector 122A may be formed easily with a small distance left therebetween, by relying on the selective diffusion technique for forming these regions prior to the formation of the insulating layers 224, 225, 223 and 229 and the electrode 133, with the result that an increased current transfer factor (base-grounded current gain) develops in the injector transistor. For those reasons described above, the dirver transistor in the SITL device of FIG. 8 can make switching actions (turn-on as well as turn-off actions) at a greatly increased speed.

As described above, according to the present invention, there can be obtained an improved SITL device which is superior in the operation speed to the prior art SITL device. The SITL device of the present invention includes an additional transistor, i.e. a bypath transistor for suppressing the occurrence of the unrequired excessive carrier injection at the current channels of the driver transistor. However, the bypath transistor is formed as a static induction transistor, so that the SITL device of the present invention allows a simple process for its manufacture as well as a high integration density thereof which may be substantially comparable to those in the prior art SITL device.

Additionally speaking, in the aforementioned embodiments, it is effective for a further enhancement of the operation speed to provide, on the source region (low resistivity layer 113), projections extending toward the corresponding current channels, as disclosed in Japanese Patent Application No. 51-143698 (corresponding U.S. Patent Application Ser. No. 855617/1977 by Jun-iche NISHIZAWA). This modification will result in a reduction in the series resistance as well as in the carrier transit time between the source and the drain, and also result in an increased transconductance. This will lead to an increase in the operation speed of the driver transistor. Moreover, a further reduction in the storage effect in the driver transistor may be attained by bringing the gate of the driver transistor into a substantial contact with the source. It should also be understood that all of the respective semiconductor layers or regions in the SITL device may be reversed in their conductivity types. Furthermore, the injector bipolar transistor may be replaced by a junction-type or MOS-type field effect transistor having a saturated drain voltage vs. drain current characteristic like a bipolar transistor. Furthermore, needless to say, the number of the drains or the current channels of the driver transistor may be changed as required. Also, the driver transistor could be replaced by a field effect transistor.

Figure 9:
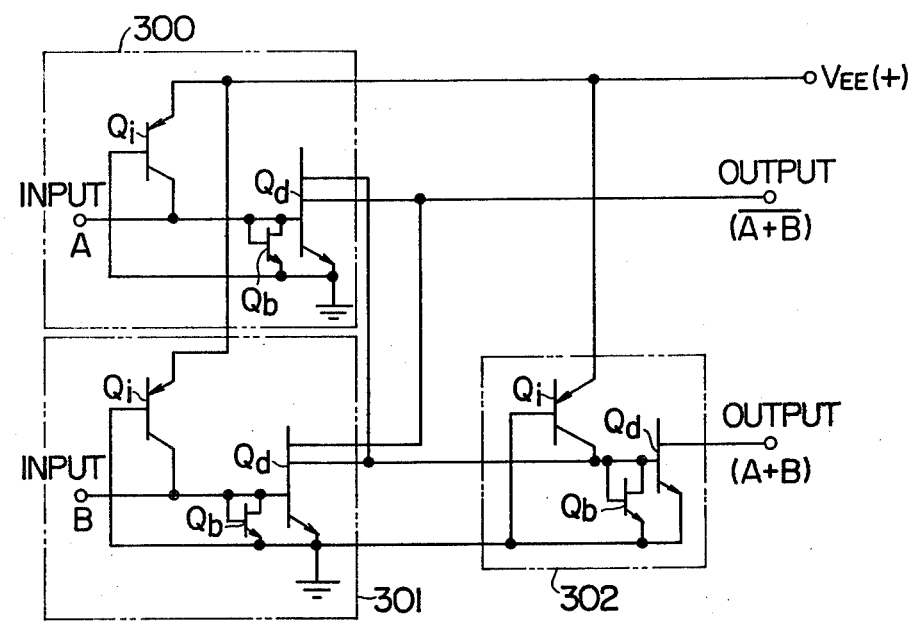
FIG. 9 is a circuit diagram showing an equivalent circuit of an example of the wired logic circuit constructed with several SITL devices embodying the present invention.

An example of the logic circuit constructed by wiring several SITL devices of the present invention is illustrated in FIG. 9. This circuit includes three circuit units 300, 301 and 302 each of which is comprised of an SITL device of the present invention such as those shown in FIGS. 5, 7 and 8, but the driver thransistor $Q_d$ of the SITL device 302 has only one drain. The respective SITL devices 300, 301 and 302 may be formed in a discrete fashion, or they may be formed integrally in a single common semiconductor wafer. The emitters of the injectors $Q_i$ in the respective SITL devices 300, 301 and 302 are connected to a line applied with a constant voltage $V_{EE}$ (positive). The sources of the driver transistors $Q_d$ in the respective SITL devices are grounded. The drains of the driver transistors $Q_d$ in the SITL devices 300 and 301 are mutually wired. At the gates of the driver transistors $Q_d$ in the SITL devices 300 and 301 are applied two input signals A and B, respectively.

When both input signals assume the logical "0" level (e.g. the low level voltage), the driver transistors $Q_d$ of the SITL devices 300 and 301 are rendered to the "off" state, and then the driver transistor $Q_d$ in the SITL device 302 is rendered to the "on" state. If both input signals A and B are at the logical "1" level (the high level voltage), the driver transistors of the SITL devices 300 and 301 will be caused to turn "on", so that the driver transistor of the SITL device 302 is turned "off". In case the input signal B is at the logical "1" level but in case the input signal A is at the logical "0" level, the driver transistor of the SITL device 301 is turned "on" while the driver transistor of the SITL device 300 is turned "off". Accordingly, in this condition, the driver transistor of the SITL device 302 is in the "off" state. In short, at the drain of the driver transistor in the SITL device 302 is delivered the logical sum (OR) of the two inputs A and B. On the other hand, the inverted logical sum (NOR) of these two inputs A and B is obtained at the respective drains of the driver transistors in the SITL devices 300 and 301.

What is claimed is:

1. An integrated semiconductor device comprising:
a first and a second static induction transistor and a third transistor, all of which being formed in a single common semiconductor body,
said first transistor including: a first semiconductor layer; a source having a first conductivity type and provided in said first semiconductor layer; a drain having said first conductivity type and provided in said first semiconductor layer; a current channel having said first conductivity type and provided in said first semiconductor layer between said drain and said source; and a gate having a second conductivity type opposite to said first conductivity type and provided adjacent to said current channel to define a boundary of said current channel, said first transistor serving as a driver transistor,
said second transistor including: a second semiconductor layer; a source having said first conductivity type and provided in said second semiconductor layer; a drain having said first conductivity type and provided in said second semiconductor layer; a current channel having said first conductivity type and provided in said second semiconductor layer between this drain and this source; and a gate having second conductivity type and located adjacent to this current channel to define a boundary of this current channel, said second transistor serving as a bypath transistor for excess gate current of said first transistor,
said third transistor including: a current injecting region and a current extracting region, both having said second conductivity type, said current extracting region being electrically connected to said gate of said first transistor and also connected to the gate and the drain of said second transistor for injecting a current thereto,
said gate of said second transistor being electrically connected to both said drain of said second transistor and said gate of said first transistor, said sources of these two transistors being electrically connected to each other.

2. An integrated semiconductor device according to claim 1, in which: both said first and second semiconductor layers are merged into a single common semiconductor layer.

3. An integrated semiconductor device according to claim 2, in which: said sources of both said first and second transistors are merged into a single common semiconductor region having said first conductivity type.

4. An integrated semiconductor device according to claim 2, in which: said gate of said second transistor is formed continuous to said gate of said first transistor.

5. An integrated semiconductor device according to claim 1, in which: said current channel of said first transistor comprises a first semiconductor region contacting a particular portion of said gate of said first transistor, and a second semiconductor region contacting a portion of said gate of said first transistor excluding said particular portion, and in which: said first semiconductor layer has said first conductivity type,
said first semiconductor region having an impurity concentration lower than those of said second semiconductor region and of said first semiconductor layer.

6. An integrated semiconductor device according to claim 5, in which: said current channel comprises a third semiconductor region contacting a certain portion of said gate of second transistor, and a fourth semiconductor region contacting a portion of said gate of said second transistor excepting said certain portion, and in which: said second semiconductor layer has said first conductivity type,
said third semiconductor region having an impurity concentration lower than those of said fourth semiconductor region and of said second semiconductor layer.

7. An integrated semiconductor device according to claim 1, in which: those portions of said gate of said first transistor other than a particular portion thereof are covered with insulator layers,
said gate of said first transistor contacting, only at said particular portion thereof, said current channel of said first transistor.

8. An integrated semiconductor device according to claim 7, in which: those portions of said gate of said second transistor other than a particular portion thereof are covered with insulator layers,
said gate of said second transistor contacting, only at said particular portion thereof, said current channel of said second transistor.

9. An integrated semiconductor device according to claim 1, in which: said first semiconductor layer has a recess provided in this layer and opening outwardly at a surface of the layer,
said gate of said first transistor extending from a particular portion of the inner surface of said recess into said first semiconductor layer.

10. An integrated semiconductor device according to claim 9, in which: said second semiconductor layer has a recess provided in this layer and opening outwardly at a surface of the layer,
said gate of the second transistor extending from a particular portion of the inner surface of the recess into the second semiconductor layer.

11. An integrated semiconductor layer according to claim 10, in which: both said recesses in said first and second semiconductor layers are formed into a common recess, and said gate of said first transistor is connected to said gate of said second transistor by a conducting layer provided in said common recess.

12. An integrated semiconductor device according to claim 1, in which said third transistor comprises
a bipolar transistor including: a third semiconductor layer; an emitter having said second conductivity type and provided in said third semiconductor layer; a collector having said second conductivity type and provided in said third semiconductor layer, said collector being electrically connected to said gate of said first transistor; and a base having said first conductivity type and provided in said third semiconductor layer between said collector and said emitter, the base being electrically connected to said source of said first transistor.

13. An integrated semiconductor device according to claim 12, in which: all of said first, second and third semiconductor layers are merged into a single common semiconductor layer having said first conductivity type.

14. An integrated semiconductor device according to claim 13, in which: said gates of said first and second transistors and said collector are a region of said single common semiconductor layer, respectively, which region having an impurity concentration lower than those of said sources of said first and second transistors.

15. An integrated semiconductor device according to claim 13, in which: all of said gates of said first and second transistors and said collector are formed continuous to each other.

16. An integrated semiconductor device according to claim 13, in which: said sources of said first and second transistors are merged into a single common semiconductor region having said first conductivity type.

17. An integrated semiconductor device according to claim 13, in which: each of said current channels of said first and second transistors comprises a first semiconductor region contacting a particular portion of the gate, and a second semiconductor region contacting a portion of the gate excluding said particular portion, said first semiconductor region having an impurity concentration lower than those of the second semiconductor region and of said single common semiconductor layer.

18. An integrated semiconductor device according to claim 12, in which: those portions of each of said gates of said first and second transistors other than a particular portion of the gate are covered with insulator layers; the gate contacting, only at said particular portion thereof, the current channel.

19. An integrated semiconductor device according to claim 13, in which: said single common semiconductor layer has at least one recess provided in the layer and opening outwardly at a surface of the layer, each of said gates of said first and second transistors extending into the layer from a particular portion of the inner surface of the recess.

20. An integrated semiconductor device according to claim 19, in which: said collector of said third transistor is formed to extend into said single common semiconductor layer from another particular portion of the inner surface of said recess.

21. An integrated semiconductor device according to claim 19, in which: said gate of said first transistor is connected to said gate of said second transistor by a conducting layer provided in said recess.

22. An integrated semiconductor device according to claim 20, in which: all of said gates of said first and second transistors and said collector of said third transistor are mutually connected by a conducting layer provided in said recess.

23. An integrated semiconductor device comprising:
a driver and bypath static induction transistor and an injector transistor;
said device and bypath static induction transistor each including source, drain, gate and channel semiconductor regions said source drain and channel regions being of a first conductivity type and said gate region being of a second conductivity type opposite to said first conductivity type, and source drain and gate regions being relatively disposed to define a first controlled current path between said source and drain regions through said channel region;

said injector transistor including first, second and control semiconductor regions, said first and second semiconductor regions being of said second conductivity type and said control semiconductor region being of said first conductivity type, said first, second, and control semiconductor regions being relatively disposed to define a second controlled current path between said first and second regions;

said integrated semiconductor device being formed in a common semiconductor body having first and second principle surfaces;

said driver transistor source region and bypath transistor source region being formed in said semiconductor body as a single first merged semiconductor region, disposed proximate to said body first principle surface;

said driver transistor gate region and said bypath transistor gate region being formed in said semiconductor body as a second merged semiconductor region, disposed proximate to said body second principle surface, a portion of said second merged semiconductor region also constituting said injector transistor first semiconductor region; and said driver transistor drain regions and said injector transistor second region being formed in said body proximate said respective ones of drain regions, respective ones of said second merged region separate electrically connected semiconductor regions, being disposed on the sides of said recesses, the electrical connection therebetween being effected by a conductive layer provided in said recess.

24. The device of claim 23 wherein said second merged region comprises a plurality of separate electrically connected semiconductor regions.

25. The device of claim 24 wherein said semiconductor body includes a plurality of recesses extending inward from said second principle surface disposed proximate said drain region, respective ones of said second merged region separate electrically connected semiconductor regions being disposed on the sides of said recesses, the electrical connection therebetween being effected by a conductive layer provided in said recess.

* * * * *